United States Patent [19]

Imamura et al.

[11] Patent Number: 5,204,278
[45] Date of Patent: Apr. 20, 1993

[54] METHOD OF MAKING MES FIELD EFFECT TRANSISTOR USING III-V COMPOUND SEMICONDUCTOR

[75] Inventors: Souichi Imamura; Toru Suga, both of Yokohama, Japan

[73] Assignee: Kabushiki Kaisha Toshiba, Kawasaki, Japan

[21] Appl. No.: 853,859

[22] Filed: Mar. 20, 1992

Related U.S. Application Data

[63] Continuation of Ser. No. 560,209, Jul. 31, 1990, abandoned.

[30] Foreign Application Priority Data

Aug. 11, 1989 [JP] Japan ................................ 1-208507

[51] Int. Cl.$^5$ ........................................ H01L 21/338
[52] U.S. Cl. ...................... 437/40; 437/176; 437/912; 437/978
[58] Field of Search .................. 437/912, 40, 41, 978, 437/175, 176, 177

[56] References Cited

U.S. PATENT DOCUMENTS

| | | | |
|---|---|---|---|
| 4,277,883 | 7/1981 | Kaplan | 437/912 |
| 4,344,980 | 8/1982 | Yoder . | |
| 4,505,023 | 3/1985 | Tseng et al. . | |
| 4,732,871 | 3/1988 | Buchmann et al. | 437/41 |
| 4,782,031 | 11/1988 | Hagio et al. . | |
| 4,863,879 | 9/1989 | Kwok | 437/41 |

FOREIGN PATENT DOCUMENTS

| | | |
|---|---|---|
| 0112657 | 7/1984 | European Pat. Off. . |
| 2358751 | 2/1978 | France . |
| 61-42963 | 3/1986 | Japan .................................. 437/912 |
| 63-291476 | 11/1988 | Japan .................................. 437/912 |

OTHER PUBLICATIONS

"An Ideal-Profile Implantation Process for GaAs Analog MMICs", GaAs IC Symposium, Technical Digest, Oct. 28-30, 1986; Ohta et al., pp. 55-58.

"Selective Area Ion Implantation for Gallium Arsenide Microwave Devices and Circuits", G.E.C. Journal of Research, vol. 1, No. 3, 1983; Bartle et al., pp. 174-177.

"A Single Step Selective Implantation Technology for Multiply Doped Layers Using Proximity Annealing", IEEE Electron Device Letters, vol. EDL-2, No. 12, Dec. 1981; Duncan et al., pp. 309-311.

Ghandhi, S. K., VLSI Fabrication Principles, John Wiley & Sons, 1983, pp. 419-429, 345-352.

*Primary Examiner*—T. N. Quach
*Attorney, Agent, or Firm*—Finnegan, Henderson, Farabow, Garrett & Dunner

[57] ABSTRACT

After a silicon nitride film is deposited on a compound semiconductor substrate, another insulating film such as a silicon dioxide film is provided thereon so as to define a channel region in the semiconductor substrate. Impurity ions such as Si ions are selectively implanted into the semiconductor substrate in the presence of the silicon nitride film and the insulating film, thereby providing source and drain regions and the channel region therein. The insulating film and the silicon nitride film located above the channel region are successively removed to provide a Schottky gate electrode thereon. The silicon nitride film is selectively removed from the substrate surface to provide source and drain electrodes on their regions. Accordingly, MESFETs can be produced without exposing the substrate surface during its manufacture.

9 Claims, 2 Drawing Sheets

1

METHOD OF MAKING MES FIELD EFFECT TRANSISTOR USING III-V COMPOUND SEMICONDUCTOR

This application is a continuation of application Ser. No. 07/560,209 filed Jul. 31, 1990, abandoned.

BACKGROUND OF THE INVENTION

1. Field of the Invention

The present invention relates to a method of making a MESFET (Metal Semiconductor Field Effect Transistor) using a III-V compound semiconductor.

2. Description of the Related Art

Various types of field effect semiconductor devices using III-V compound semiconductors have been recently proposed. As one of the field effect semiconductor devices, for example, a MESFET with a Schottky gate electrode using a semi-insulating GaAs substrate is made by a process shown in FIGS. 1A to 1C. As shown in FIG. 1A, after a silicon oxide layer 2 having a thickness of 5000 Å is formed on a surface of a semi-insulating GaAs substrate 1, openings 4 and 5 for source and drain regions are formed therein, using a resist layer 3 as a mask. Si ions are implanted into the exposed surface of the substrate 1 to provide source and drain regions 6 and 7 therein.

As illustrated in FIG. 1B, the silicon oxide layer 2 located between source and drain regions 6 and 7, which define a channel region, is removed, and the surface of substrate 1 is covered with a resist layer 8. The resist layer 8 is patterned to provide an opening 9 therein. Si ions are implanted again into the exposed surface of substrate 1 through the opening 9 to form a channel region 10 between source and drain regions 6 and 7. The substrate 1 is heat-treated to activate the implanted Si ions. As shown in FIG. 1C, ohmic electrodes 11 and 12 of an Au—Ge alloy are provided on source and drain regions 6 and 7, respectively, and Schottky gate electrode 13 of a Ti—Pt—Au layer is provided on the channel region 10, thereby obtaining a MESFET.

Since, however, the vapor pressure of As is high in III-V compound semiconductors, especially the GaAs substrate, careful consideration has been required for providing FETs such as MESFETs on the substrate. In such a MESFET, it is necessary to lower the impurity concentration of the channel region as compared with that of source and drain regions, and it is required to keep the depth of the channel region at approximately 0.1 μm. A photolithography process is also required for forming these regions and electrodes. In the photolithography process, unwanted contamination due to resist residue is caused or the substrate surface is damaged by the heat-treatment. Accordingly, desired characteristics of the MESFET cannot be obtained. Furthermore, passivation must be taken into consideration to stabilize the characteristics of the device.

SUMMARY OF THE INVENTION

Therefore, it is an object of the present invention to provide a method of making an improved MESFET.

It is another object of the present invention to provide a method of making a MESFET without exposing a surface of a compound semiconductor substrate.

According to an aspect of the present invention, after a silicon nitride layer is deposited on a surface of a compound semiconductor substrate, another insulating layer for defining a channel region is formed thereon. Desired impurity ions are selectively implanted into the substrate in the presence of the silicon nitride layer and the insulating layer to provide source, drain and channel regions therein. Thereafter, the insulating layer and silicon nitride layer located above the channel region are successively removed to provide a Schottky gate electrode, and the silicon nitride layer is selectively removed from the substrate surface to provide source and drain regions.

BRIEF DESCRIPTION OF THE DRAWINGS

The novel and distinctive features of the present invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

A method of making a MESFET according to an embodiment of the present invention will be described with reference to FIGS. 2A to 2D.

A silicon nitride layer 21 is deposited on a surface of a semi-insulating substrate of a III-V compound semiconductor, e.g., GaAs substrate 20 to a thickness of the order of 1500 Å by LPCVD (Low Pressure Chemical Vapor Deposition) techniques, on which a silicon oxide layer 22 having a thickness of about 1000 Å is deposited by CVD techniques. The silicon oxide layer 22 is selectively removed from the substrate surface except an intended channel region by well-known photolithography techniques. The removed portion of layer 22 is enclosed with a dotted line shown in FIG. 2A, and a region overlain the remained silicon oxide layer 22 is the remainder of the resist layer used in the photolithography process. As the photolithography process, both isotropic and anisotropic etchings may be used. More specifically, isotropic etching using ammonium fluoride or anisotropic etching such as reactive ion etching (RIE) utilizing Freon system gases may be applicable to the etching of the silicon layer 22, because the silicon oxide layer 22 is selectively removed without affecting the silicon nitride layer 21.

Figure 1A:
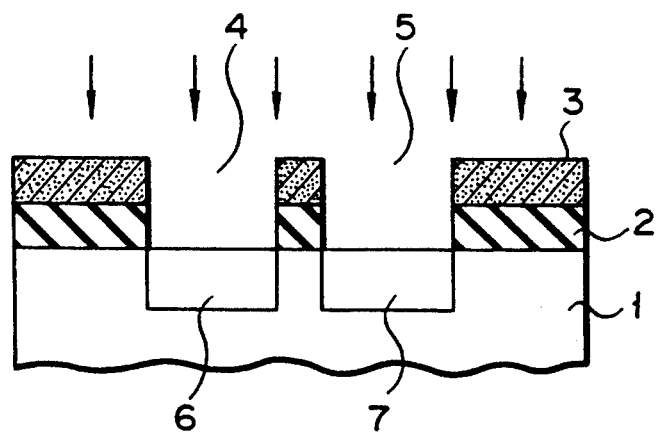
FIGS. 1A to 1C are cross-sectional views showing a conventional process for making a MESFET.
Figure 1B:
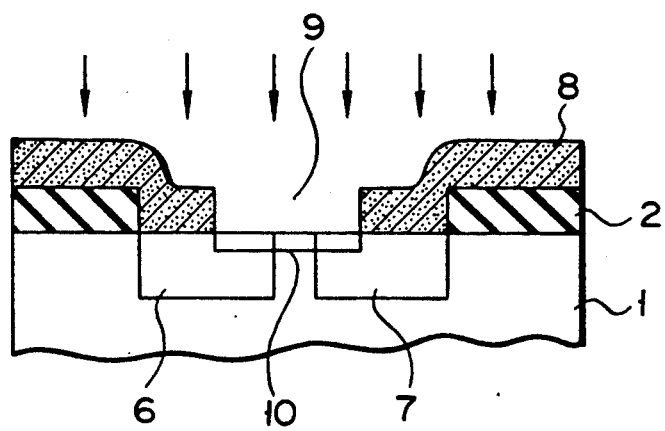
Figure 1C:
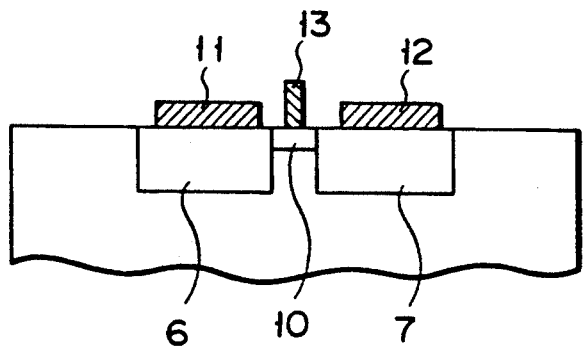
Figure 2A:
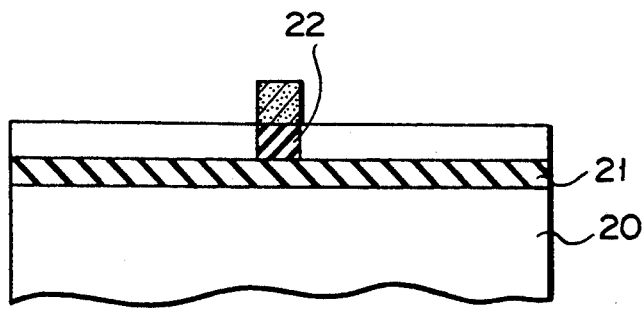
FIGS. 2A to 2D are cross-sectional view showing a process of making a MESFET according to an embodiment of the present invention.
Figure 2B:
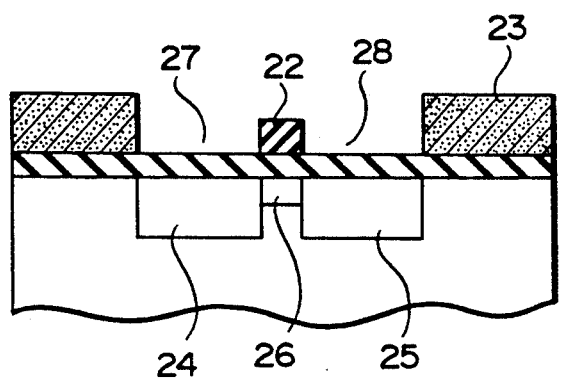

As is apparent from FIG. 2B, a resist layer 23 with a desired pattern is formed on the silicon nitride layer 21 except the remained silicon oxide layer 22 which covers the intended channel region. In order to render an impurity concentration difference between drain and source regions 24 and 25 and a channel region 26 in a subsequent ion implantation process, the silicon oxide layer 22, located between openings 27 and 28 for forming drain and source regions 24 and 25, and the resist layer 23 are used as ion implantation masks. The width of silicon oxide layer 22 is approximately 2 μm, and the width of the channel region 26 formed under the silicon oxide layer 22 is 1.6 μm.

Ion implantation is performed in the presence of both the silicon nitride layer 21 and the silicon oxide layer 22 selectively provided thereon. Si ions are introduced into the GaAs semi-insulating substrate 20 by an ion implantation step using different acceleration voltages of 250

Figure 2C:
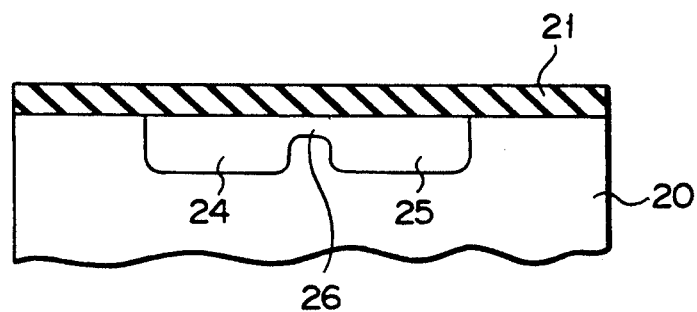
Figure 2D:
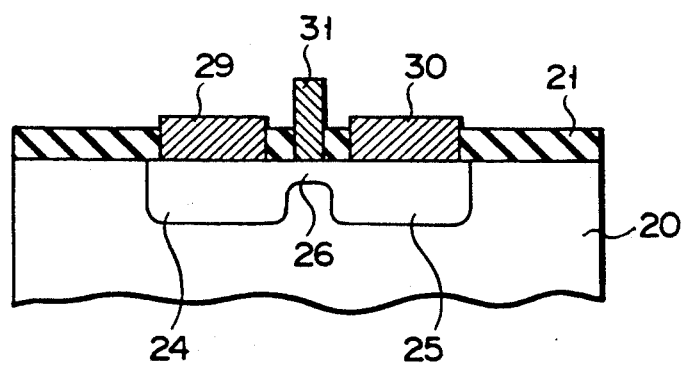

KeV and 120 KeV to provide N-type drain and source regions 24 and 25 having an impurity concentration of $10^{13}/cm^3$. In the ion implantation, since the silicon oxide layer 22 is further provided on the intended channel region, the impurity concentration of the channel region 26 is decreased by one order as compared with that of drain and source regions, and becomes $10^{12}/cm^3$. The ion step is performed with two successive different acceleration voltages for the reason that the impurity concentrations of the respective regions are made uniform in their depth directions. The silicon oxide layer 22 is removed by the isotropic or anisotropic etching technique without damaging the silicon nitride layer 21. In the subsequent annealing process, the activation treatment is carried out in an inert atmosphere (nitrogen or argon) to complete regions 24, 25 and 26. Resist layer 23 is then removed to obtain a structure having a cross section as shown in FIG. 2C. As shown in FIG. 2D, in a final process, drain and source electrodes 29 and 30 and a Schottky gate electrode 31 will be provided. After the silicon nitride layer 21 corresponding to the channel region 26 is selectively removed from the substrate surface by photolithography techniques, Ti, Pt and Au are successively deposited on the exposed surface of the channel region 26 by sputtering or vacuum evaporation techniques to a thickness of about 1000 Å, about 500 Å and about 5000 Å, respectively, thereby providing a Schottky gate electrode 31 thereon.

Similarly, the silicon nitride layer 21 facing drain and source regions 24 and 25 is selectively removed from the substrate surface by the photolithography technique, and then an Au—Ge alloy is deposited on the exposed substrate surface to a thickness of about 0.2 μm by sputtering or vacuum evaporation techniques, thereby providing drain and source electrodes 29 and 30. The Ge content of the alloy is 5 to 10% by weight.

According to the present invention as described above, since the semi-insulating substrate is treated without exposing the substrate surface, MESFETs with stable characteristics can be easily provided. In addition, since the composition of the semi-insulating substrate having the high vapor pressure is not changed by the silicon nitride layer, MESFETs with a good humidity resisting property can be obtained.

It is further understood by those skilled in the art that the foregoing description is a preferred embodiment of the disclosed method and that various changes and modifications may be made in the invention without departing from the spirit and scope thereof.

What is claimed is:

1. A method of making a MES field effect transistor comprising the steps of:

depositing a first insulating film on a surface of a compound semiconductor substrate;

depositing a second insulating film on said first insulating film, said second insulating film being comprised of a silicon dioxide film having a thickness of about 1000 Å;

selectively removing said second insulating film by means of lithography techniques except a portion corresponding to a channel region;

coating said first insulating film with a resist layer;

patterning said resist layer so as to define intended source and drain regions with both the residual resist layer and said selectively removed second insulating film;

subjecting said semiconductor substrate to an ion implantation using different acceleration voltages in the presence of both said first and second insulating films to provide source and drain regions and said channel region;

subjecting said semiconductor substrate to a heat-treatment to activate said ion-implanted regions;

successively removing said second insulating film and said first insulating film formed on said channel region;

forming a Schottky gate electrode on said channel region;

selectively removing said first insulating film from the substrate surface of said source and drain regions; and forming an electrode on said source and drain regions.

2. A method as set forth in claim 1, wherein said first insulating film is comprised of a silicon nitride film.

3. A method as set forth in claim 1, wherein said compound semiconductor substrate is composed of a semi-insulating material of a III–V compound semiconductor.

4. A method as set forth in claim 3, wherein said semi-insulating material is composed of GaAs.

5. A method as set forth in claim 1, wherein Si ions are implanted into said semiconductor substrate through said first insulating film to provide said source and drain regions therein.

6. A method as set forth in claim 5, wherein said source and drain regions are comprised of N-type conductivity.

7. A method as set forth in claim 1, wherein Si ions are implanted into said semiconductor substrate through said second and first insulating films to provide said channel region therein.

8. A method as set forth in claim 7, wherein said channel region is comprised of N-type conductivity.

9. A method as set forth in claim 1, wherein said first insulating film serves as a passivation film.

* * * * *